(12) United States Patent
Wang (10) Patent No.: US 12,452,990 B2
(45) Date of Patent: Oct. 21, 2025

(54) COMPOSITE HEAT DISSIPATION STRUCTURE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventor: Wei Wang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/022,262

(22) PCT Filed: May 19, 2022

(86) PCT No.: PCT/CN2022/093903
§ 371 (c)(1),
(2) Date: Feb. 20, 2023

(87) PCT Pub. No.: WO2023/221045
PCT Pub. Date: Nov. 23, 2023

(65) Prior Publication Data
US 2024/0276631 A1    Aug. 15, 2024

(51) Int. Cl.
*H05K 1/02*     (2006.01)
*H01Q 1/02*     (2006.01)
(Continued)

(52) U.S. Cl.
CPC ............. *H05K 1/0201* (2013.01); *H01Q 1/02* (2013.01); *H01Q 1/38* (2013.01); *H05K 1/028* (2013.01);
(Continued)

(58) Field of Classification Search
CPC ........ H01Q 1/02; H01Q 1/138; H05K 1/0201; H05K 1/028; H05K 1/16; H05K 2201/10098; H05K 2201/10128
See application file for complete search history.

(56) References Cited

U.S. PATENT DOCUMENTS

2014/0240179 A1* 8/2014 Kim ................. H01Q 1/02
29/601
2015/0123860 A1* 5/2015 Park ................ H01Q 1/526
343/720
(Continued)

FOREIGN PATENT DOCUMENTS

| CN | 105051840 A | 11/2015 |
| CN | 206163493 U | 5/2017 |

(Continued)

*Primary Examiner* — Nathan Milakovich
(74) *Attorney, Agent, or Firm* — IPro, PLLC (57) ABSTRACT

The composite heat dissipation structure includes a grid tape, a buffer layer and a ferrite layer that are stacked in sequence, and a flexible printed circuit board arranged at one side of the ferrite layer facing the grid tape. The flexible printed circuit board includes a substrate and a conductive layer on at least one side of the substrate. The conductive layer has a heat dissipation pattern and a communication antenna pattern, and an orthographic projection of the heat dissipation pattern on the substrate and an orthographic projection of the communication antenna pattern on the substrate do not overlap each other.

18 Claims, 6 Drawing Sheets

(51) Int. Cl.
  *H01Q 1/38* (2006.01)
  *H05K 1/16* (2006.01)
(52) U.S. Cl.
  CPC ..... *H05K 1/16* (2013.01); *H05K 2201/10098* (2013.01); *H05K 2201/10128* (2013.01)

(56) References Cited

U.S. PATENT DOCUMENTS

| | | |
|---|---|---|
| 2016/0035481 A1 | 2/2016 | Hachiya et al. |
| 2017/0134072 A1 | 5/2017 | Wu |
| 2018/0205131 A1 | 7/2018 | Hwang et al. |
| 2021/0100090 A1* | 4/2021 | Chang ................. H05K 1/0201 |
| 2022/0013889 A1 | 1/2022 | Choi et al. |

FOREIGN PATENT DOCUMENTS

| | | |
|---|---|---|
| CN | 107069185 A | 8/2017 |
| CN | 107735902 A | 2/2018 |
| CN | 109633983 A | 4/2019 |
| CN | 113922057 A | 1/2022 |
| JP | 2004349400 A | 12/2004 |

* cited by examiner

COMPOSITE HEAT DISSIPATION STRUCTURE AND DISPLAY APPARATUS

CROSS-REFERENCE OF RELATED APPLICATIONS

The present application is a national phase entry under 35 U.S.C. § 371 of International Application No. PCT/CN2022/093903 filed on May 19, 2022, the entire content of which is hereby incorporated by reference.

FIELD

The present disclosure relates to the technical field of communication, and particularly relates to a composite heat dissipation structure and a display apparatus.

BACKGROUND

In the general case of products such as mobile phones, communication antennas of Bluetooth (BT), wireless fidelity (WIFI), near field communication (NFC), etc. are arranged at frames of the products. Alternatively, corresponding flexible printed circuit (FPC) antennas are designed independently and attached to the frames. In this way, radiation capacity of the antennas is limited.

SUMMARY

The present disclosure provides a composite heat dissipation structure and a display apparatus. The solution is as follows.

Embodiments of the present disclosure provide a composite heat dissipation structure, including:
- a grid tape, a buffer layer, and a ferrite layer that are stacked in sequence, and a flexible printed circuit board arranged at one side of the ferrite layer facing the grid tape.

The flexible printed circuit board includes a substrate and a conductive layer on at least one side of the substrate. The conductive layer has a heat dissipation pattern and a communication antenna pattern. An orthographic projection of the heat dissipation pattern on the substrate and an orthographic projection of the communication antenna pattern on the substrate do not overlap each other.

Optionally, in the embodiments of the present disclosure, the grid tape or the buffer layer is reused as the substrate. The flexible printed circuit board is located between the ferrite layer and the buffer layer.

Optionally, in the embodiments of the present disclosure, the conductive layer includes a first conductive layer arranged at one side of the substrate facing the ferrite layer.

Optionally, in the embodiments of the present disclosure, the conductive layer further includes a second conductive layer arranged at one side of the substrate facing away from the ferrite layer.

Optionally, in the embodiments of the present disclosure, the communication antenna pattern is distributed on both the first conductive layer and the second conductive layer. The communication antenna pattern distributed on the first conductive layer does not overlap the communication antenna pattern distributed on the second conductive layer. The communication antenna pattern distributed on the first conductive layer and the communication antenna pattern distributed on the second conductive layer are connected to each other through a via hole penetrating the substrate.

Optionally, in the embodiments of the present disclosure, each communication antenna pattern includes at least one turn of coil and two lead wires coupled to two end points of the at least one coil correspondingly. Orthographic projections of turns of coils on the substrate do not overlap each other.

Optionally, in the embodiments of the present disclosure, the heat dissipation pattern includes a part surrounded by the coil and a part surrounding the coil.

Optionally, in the embodiments of the present disclosure, a distance between the coil and the adjacent heat dissipation pattern is not smaller than 1 mm.

Optionally, in the embodiments of the present disclosure, the heat dissipation pattern is grounded.

Accordingly, embodiments of the present disclosure provide a display apparatus, including:
- a display panel, and the composite heat dissipation structure attached to a back face of the display panel according to any one of items mentioned above.

The grid tape of the composite heat dissipation structure is attached to the back face of the display panel.

Optionally, in the embodiments of the present disclosure, the display panel includes: a flat plate part, a bent part and a fixed part. The bent part is located between the flat plate part and the fixed part, and the fixed part is bent to reach a back face of the flat plate part by means of the bent part.

The display apparatus further includes: a support film arranged between the flat plate part and the composite heat dissipation structure, and a display circuit board arranged between the fixed part and the composite heat dissipation structure. The display circuit board is coupled to the communication antenna pattern in the composite heat dissipation structure.

Optionally, in the embodiments of the present disclosure, the display circuit board and the communication antenna pattern are welded by means of a welding point of the display circuit board and/or crimped by means of an elastic sheet crimping point.

DETAILED DESCRIPTION OF THE EMBODIMENTS

For making objectives, technical solutions and advantages of embodiments of the present disclosure clearer, the technical solutions of the embodiments of the present disclosure will be clearly and completely described below in conjunction with the accompanying drawings in the embodiments of the present disclosure. Apparently, the embodiments described are some rather than all of the embodiments of the present disclosure. The embodiments in the present disclosure and features of the embodiments can be combined with each other without conflict. Based on the embodiments of the present disclosure, all other embodiments obtained by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. "Including", "comprising", and other similar words used in the present disclosure indicate that elements or objects before the word include elements or objects after the word and their equivalents, without excluding other elements or objects.

Figure 1:
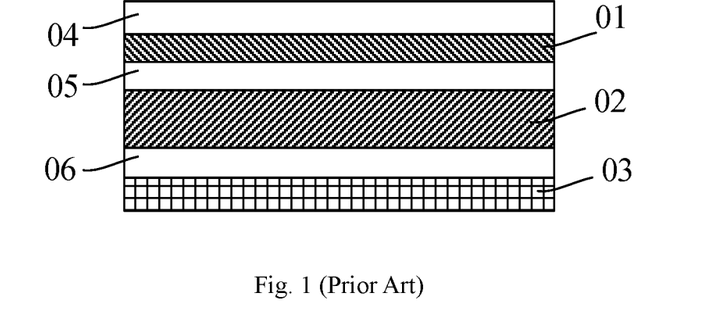
FIG. 1 is a schematic structural diagram of a composite heat dissipation film in the related art.

In the related art, a display screen generally uses a composite heat dissipation film as shown in FIG. 1. The composite heat dissipation film includes embossing (EMBO) 01, foam 02 and copper (Cu) foil 03 that are stacked in sequence. In order to ensure an attaching effect between film layers in the composite heat dissipation film, as shown in FIG. 1, the composite heat dissipation film is further provided with a first adhesive layer 04, a second adhesive layer 05 and a third adhesive layer 06. The first adhesive layer 04 and the second adhesive layer 05 are arranged at two opposite sides of the grid tape 01. The third adhesive layer 06 is arranged between the foam 02 and the copper foil 03. In this way, the composite heat dissipation film may block light, prevent light leakage and avoid influence of a signal of a mainboard of a mobile phone on noise of the display screen. In practical research, the inventor found that if an antenna pattern is directly made on the copper foil 03 as shown in FIG. 1, it is difficult to ensure manufacturing accuracy of an antenna.

In view of this, embodiments of the present disclosure provide a composite heat dissipation structure and a display apparatus, which are configured to achieve a communication function of an antenna while giving consideration to heat dissipation.

Figure 2:
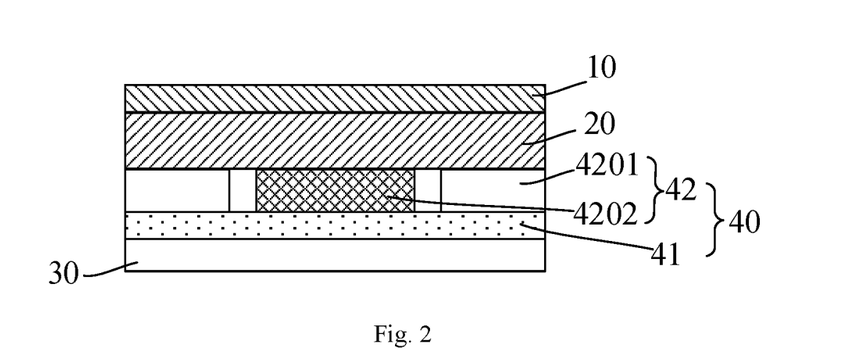
FIG. 2 is a schematic structural diagram of a composite heat dissipation structure according to an embodiment of the present disclosure.

As shown in FIG. 2, embodiments of the present disclosure provide a composite heat dissipation structure.

The composite heat dissipation structure includes a grid tape 10, a buffer layer 20 and a ferrite layer 30 that are stacked in sequence, and a flexible printed circuit board 40 arranged at one side of the ferrite layer 30 facing the grid tape 10.

The flexible printed circuit board 40 includes a substrate 41 and a conductive layer 42 on at least one side of the substrate 41. The conductive layer 42 is provided with a heat dissipation pattern 4201 and a communication antenna pattern 4202. An orthographic projection of the heat dissipation pattern 4201 on the substrate 41 and an orthographic projection of the communication antenna pattern 4202 on the substrate 41 do not overlap each other.

In an implementation process, the composite heat dissipation structure includes the grid tape 10, the buffer layer 20 and the ferrite layer 30 that are stacked in sequence, and the flexible printed circuit board 40 arranged at one side of the ferrite layer 30 facing the grid tape 10. The grid tape 10 may be provided with a patterned light shielding material. The light shielding material may be black, so as to shield light to a certain extent. The composite heat dissipation structure including the grid tape 10 may be used in the display apparatus, so as to ensure a desirable display effect. In an exemplary embodiment, the buffer layer 20 may be foam made of an acrylic material, and mainly plays a buffering role, so as to buffer and protect related components. The ferrite layer 30 may be made of a high-temperature sintered ferrite material. In an exemplary embodiment, for a handheld terminal based on near field communication (NFC), the ferrite layer 30 may be arranged on an electronic tag. On one hand, absorption of a signal magnetic field by metal is reduced; and on the other hand, the ferrite layer 30 is made of a high-temperature sintered ferrite material, such that magnetic conductivity is improved. In this way, magnetic flux may be converged, interference of a metal environment at a back of a terminal on an antenna is reduced, an induction distance is effectively increased, and communication quality is ensured.

The composite heat dissipation structure further includes the flexible printed circuit board 40 arranged at one side of the ferrite layer 30 facing the grid tape 10. The flexible printed circuit board 40 includes the substrate 41 and the conductive layer 42 on the at least one side of the substrate 41. In an exemplary embodiment, the conductive layer 42 is located at one of two opposite sides of the substrate 41. In another exemplary embodiment, the conductive layers 42 are located at the two opposite sides of the substrate 41. Certainly, the conductive layer 42 on the substrate 41 may be further arranged according to actual application needs, which is not limited herein. In addition, the conductive layer 42 is provided with the heat dissipation pattern 4201 and the communication antenna pattern 4202, and the orthographic projection of the heat dissipation pattern 4201 on the substrate 41 and the orthographic projection of the communication antenna pattern 4202 on the substrate 41 do not overlap each other. A structure of the heat dissipation pattern 4201 may have a heat dissipation function, and may conduct heat generated in an operation process of a device, such that influence on service life of the device due to an excessive temperature is avoided. The heat dissipation pattern 4201 may further have an antistatic function, such that multifunctional design of the composite heat dissipation structure is ensured. A structure of the communication antenna pattern 4202 has a communication function. A communication antenna may be one or more of a Bluetooth (BT) antenna, a wireless fidelity (WIFI) antenna, an NFC antenna, and a ZigBee antenna, so as to achieve integration of at least one antenna into the composite heat dissipation structure. In this way, heat dissipation and the communication antenna of the composite heat dissipation structure are integrated, such that the composite heat dissipation structure has both a heat dissipation function and a communication function. The orthographic projection of the heat dissipation pattern 4201 on the substrate 41 and the orthographic projection of the communication antenna pattern 4202 on the substrate 41 do not overlap each other, such that mutual interference between heat dissipation and communication is effectively avoided. Furthermore, the conductive layer 42 of the flexible printed circuit board 40 may form the heat dissipation pattern 4201 and the communication antenna pattern 4202 on the substrate 41, so as to ensure manufacturing accuracy of the antenna. It should be noted that when the communication antenna pattern 4202 is integrated by various antenna patterns, orthographic projections of the antenna patterns on the substrate 41 do not overlap each other, such that communication interference between a plurality of antennas is avoided, and usability of the composite heat dissipation structure is ensured.

In embodiments of the present disclosure, the grid tape 10 or the buffer layer 20 is reused as the substrate 41.

In an exemplary embodiment, the grid tape 10 may be reused as the substrate 41 in the flexible printed circuit board 40. In an exemplary embodiment, the buffer layer 20 may be reused as the substrate 41 in the flexible printed circuit board 40. In this way, the heat dissipation and communication functions of the composite heat dissipation structure are taken into account while the composite heat dissipation structure is prevented from being too thick.

In embodiments of the present disclosure, the flexible printed circuit board 40 is located between the ferrite layer 30 and the buffer layer 20.

In an exemplary embodiment, the flexible printed circuit board 40 may be located between the ferrite layer 30 and the buffer layer 20. In an implementation process, the substrate 41 of the flexible printed circuit board 40 may be made of polyimide (PI) or polyethylene terephthalate (PET). A copper foil may be attached to the substrate 41 of the corresponding material, then a desired pattern(s) is/are formed on the copper foil, and then the substrate is attached to one side of the buffer layer 20 close to the ferrite layer 30. The related patterns are formed on the substrate 41 of the flexible printed circuit board 40, such that manufacturing accuracy of the patterns is ensured, and usability of the composite heat dissipation structure is further ensured.

In embodiments of the present disclosure, the conductive layer 42 includes a first conductive layer 421 arranged at one side of the substrate 41 facing the ferrite layer 30.

Figure 3:
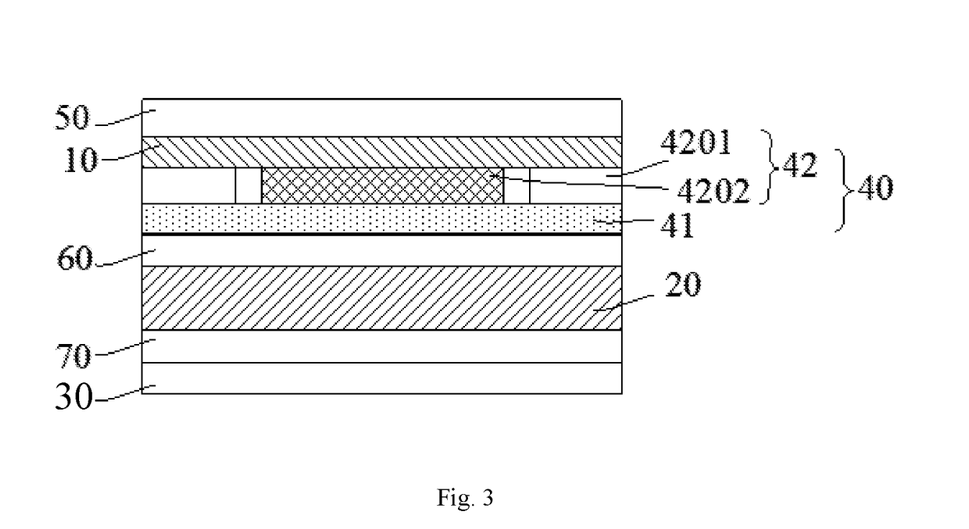
FIG. 3 is a schematic structural diagram of a composite heat dissipation structure according to an embodiment of the present disclosure.
Figure 4:
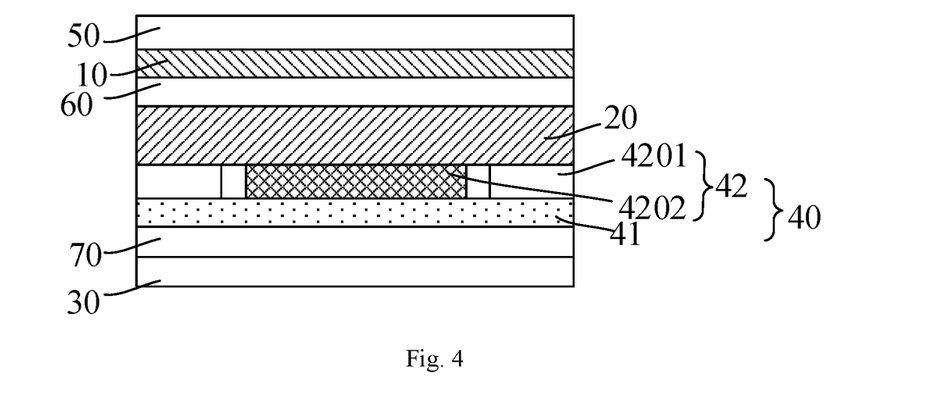
FIG. 4 is a schematic structural diagram of a composite heat dissipation structure according to an embodiment of the present disclosure.
Figure 5:
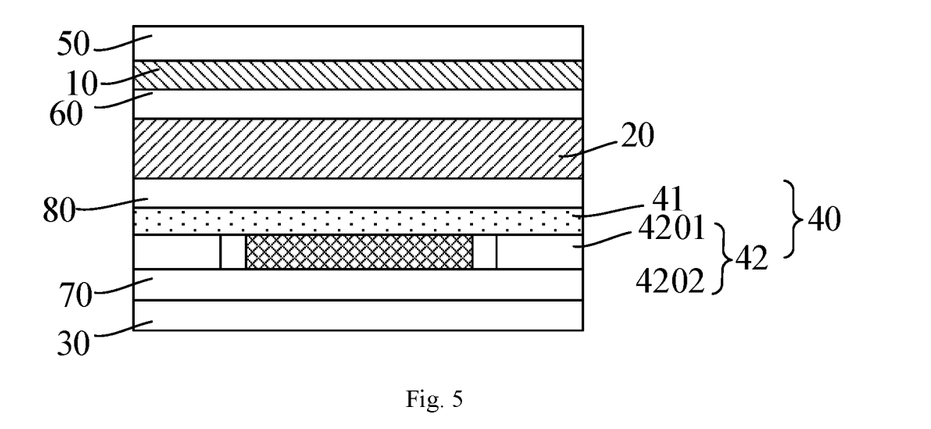
FIG. 5 is a schematic structural diagram of a composite heat dissipation structure according to an embodiment of the present disclosure.

In an implementation process, the conductive layer 42 may only include the first conductive layer 421 arranged at one side of the substrate 41 facing the ferrite layer 30. Accordingly: the flexible printed circuit board 40 is a single-layer board. In an exemplary embodiment, as shown in FIG. 3, the grid tape 10 is reused as the substrate 41. In an exemplary embodiment, as shown in FIG. 4, the buffer layer 20 is reused as the substrate 41. In an exemplary embodiment, as shown in FIG. 5, the flexible printed circuit board 40 is located between the ferrite layer 30 and the buffer layer 20.

In embodiments of the present disclosure, the conductive layer 42 further includes a second conductive layer 422 arranged at one side of the substrate 41 facing away from the ferrite layer 30.

Figure 6:
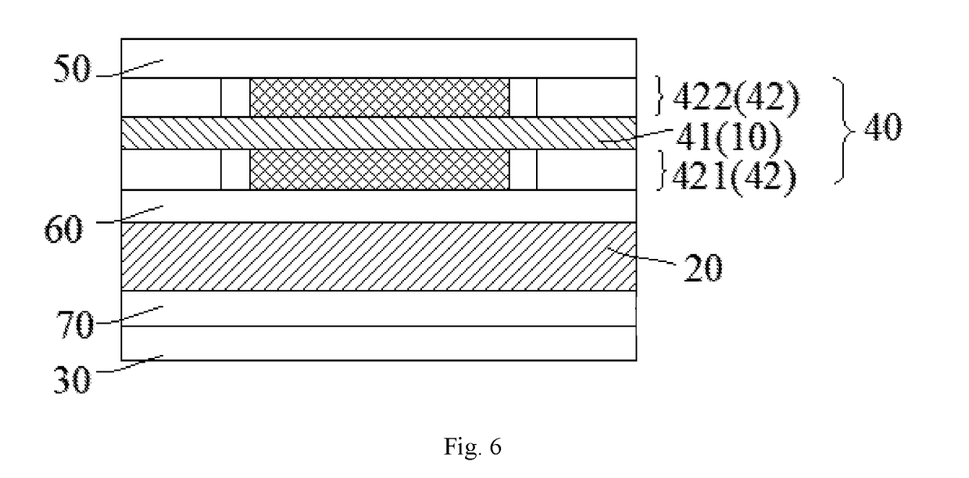
FIG. 6 is a schematic structural diagram of a composite heat dissipation structure according to an embodiment of the present disclosure.
Figure 7:
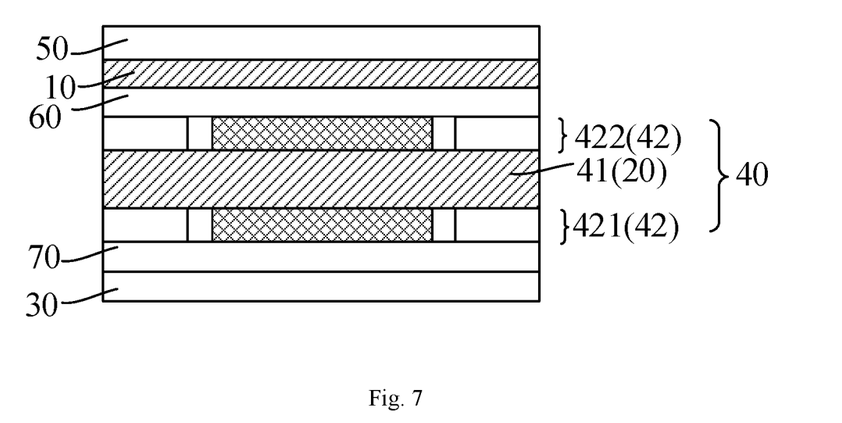
FIG. 7 is a schematic structural diagram of a composite heat dissipation structure according to an embodiment of the present disclosure.
Figure 8:
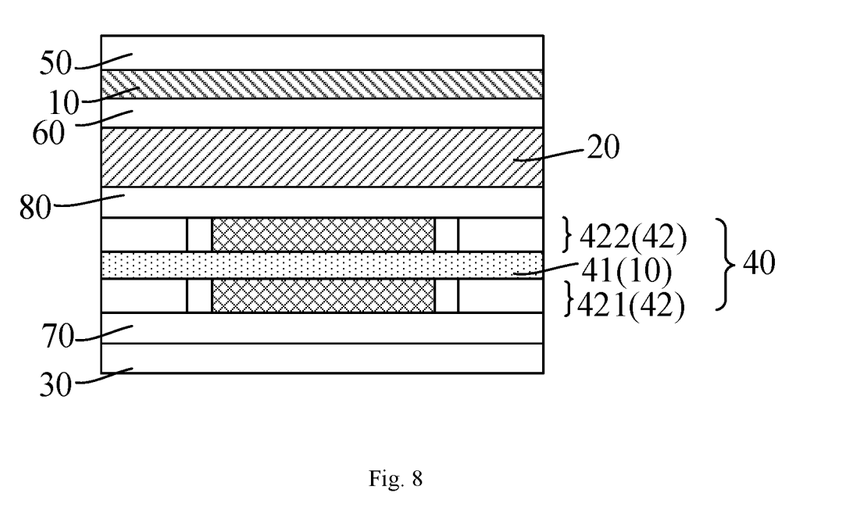
FIG. 8 is a schematic structural diagram of a composite heat dissipation structure according to an embodiment of the present disclosure.

In an implementation process, the conductive layer 42 may include the first conductive layer 421 arranged at one side of the substrate 41 facing the ferrite layer 30, and the second conductive layer 422 arranged at one side of the substrate 41 facing away from the ferrite layer 30. Accordingly, in an exemplary embodiment, as shown in FIG. 6, the grid tape 10 is reused as the substrate 41. In an exemplary embodiment, as shown in FIG. 7, the buffer layer 20 is reused as the substrate 41. In an exemplary embodiment, as shown in FIG. 8, the flexible printed circuit board 40 is located between the ferrite layer 30 and the buffer layer 20.

It should be noted that in a process of arranging the conductive layer 42 in forms shown in FIGS. 3-8 and further manufacturing a required composite heat dissipation structure, a sticky layer may be arranged between adjacent film layers. Furthermore, as shown in FIGS. 3-8, the composite heat dissipation structure may include a first sticky layer 50, a second sticky layer 60, a third sticky layer 70, and a fourth sticky layer 80. In this way, structural stability of the composite heat dissipation structure is ensured, and usability of the composite heat dissipation structure is further improved.

In the embodiments of the present disclosure, the communication antenna patterns 4202 are distributed on both the first conductive layer 421 and the second conductive layer 422, and the communication antenna pattern 4202 distributed on the first conductive layer 421 does not overlap the communication antenna pattern 4202 distributed on the second conductive layer 422, and the communication antenna pattern 4202 distributed on the first conductive layer 421 is connected to the communication antenna pattern 4202 distributed on the second conductive layer 422 through a via hole penetrating the substrate 41.

In an implementation process, the conductive layer 42 includes the first conductive layer 421 arranged at one side of the substrate 41 facing the ferrite layer 30, and the second conductive layer 422 arranged at one side of the substrate 41 facing away from the ferrite layer 30. Accordingly, the flexible printed circuit board 40 is a double-layer board. Moreover, the communication antenna patterns 4202 may be distributed on both the first conductive layer 421 and the second conductive layer 422, and the communication antenna patterns 4202 distributed on the first conductive layer 421 and the second conductive layer 422 do not overlap each other and are connected to each other through the via hole penetrating the substrate 41, such that design of multi-turn coils of communication antennas is ensured, and antenna radiation performance of the composite heat dissipation structure is improved.

In the embodiments of the present disclosure, the communication antenna pattern 4202 includes at least one turn of coil 90 and two lead wires 900 coupled to two end points of the at least one turn of coil 90 correspondingly. Orthographic projections of all turns of coils 90 on the substrate 41 do not overlap each other.

In the embodiments of the present disclosure, the heat dissipation pattern 4201 includes a part surrounded by the coil 90 and a part surrounding the coil 90.

Figure 9:
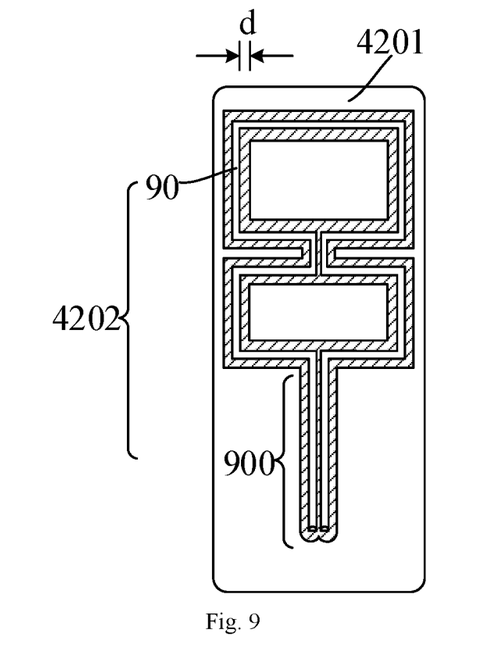
FIG. 9) is a schematic structural diagram of a top view of a composite heat dissipation structure according to an embodiment of the present disclosure.
Figure 10:
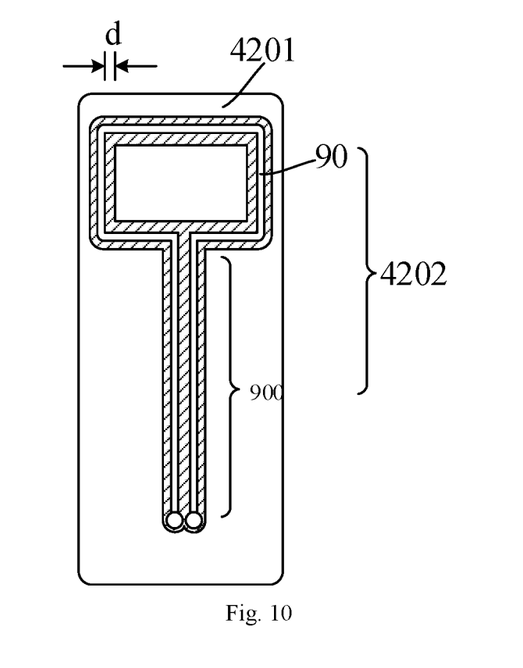
FIG. 10 is a schematic structural diagram of a top view of a composite heat dissipation structure according to an embodiment of the present disclosure.

In an implementation process, when the composite heat dissipation structure as shown in FIGS. 3-5 is used, the communication antenna pattern 4202 may be arranged in a form shown in FIG. 9, and alternatively, the communication antenna patterns 4202 may be arranged in a form shown in FIG. 10. Accordingly, reference may still be made to FIGS. 9 and 10 for arrangement between the heat dissipation pattern 4201 and the communication antenna pattern 4202.

Figure 11:
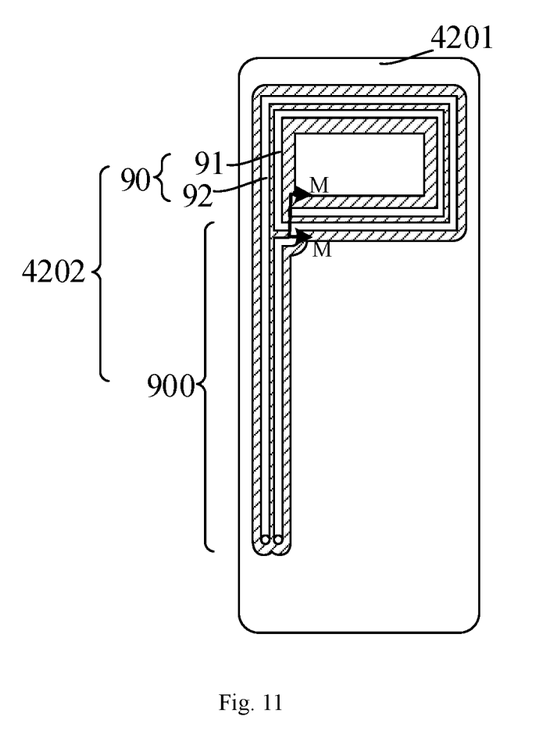
FIG. 11 is a schematic structural diagram of a top view of a composite heat dissipation structure according to an embodiment of the present disclosure.

In an implementation process, when the composite heat dissipation structure as shown in FIGS. 6-8 is used, the communication antenna pattern 4202 may be arranged in a form shown in FIG. 11. Accordingly, reference may still be made to a form shown in FIG. 11 for arrangement between the heat dissipation pattern 4201 and the communication antenna pattern 4202.

In the embodiments of the present disclosure, a distance between the coil 90 and the adjacent heat dissipation pattern 4201 is not smaller than 1 mm. In an implementation process, the distance between the coil 90 and the adjacent heat dissipation pattern 4201 may be d as shown in FIGS. 9-11, and accordingly, d>1 mm. In this way, mutual interference between a heat dissipation function and a communication antenna function in the composite heat dissipation structure is avoided, and usability of the composite heat dissipation structure is ensured.

Figure 12:
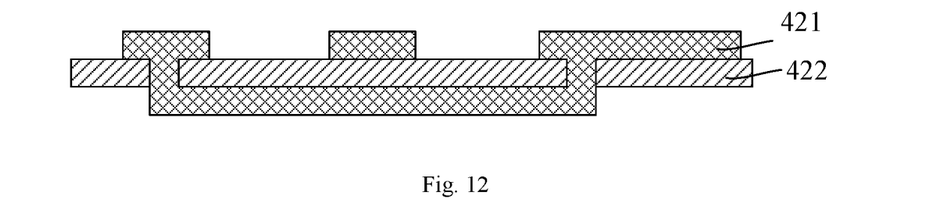
FIG. 12 is a schematic structural diagram of a section in direction MM in FIG. 11.

In an implementation process. FIG. 12 shows a schematic structural diagram of a section in direction MM in FIG. 11. Furthermore, as shown in FIG. 12, the communication antenna patterns 4202 include a first turn of coil 91 distributed on the second conductive layer 422 and a second turn of coil 92 distributed on the first conductive layer 421. An orthographic projection of the second turn of coil 92 on the substrate 41 surrounds an orthographic projection of the first turn of coil 91 on the substrate 41. The first turn of coil 91 may be led out to the second turn of coil 92 through the second conductive layer 422 and the via hole penetrating the substrate 41, and the first turn of coil 91 and the second turn of coil 92 do not overlap each other and are connected to each other through the via hole penetrating the substrate 41. In this way, design of multi-turn coils of the communication antenna patterns 4202 is achieved, and antenna radiation performance is ensured.

It should be noted that in addition to being arranged in the forms mentioned above, the heat dissipation pattern 4201 and the communication antenna pattern 4202 may be arranged in other forms according to actual application needs, which are not limited herein. The conductive layer 42 in the embodiments of the present disclosure may be made of at least one of metal materials such as gold (Au), silver (Ag) and copper (Cu), or made of non-metal materials such as graphene. Certainly, the conductive layer 42 may also be made of other materials having desirable thermal conductivity according to actual application needs, which are not limited herein.

In the embodiments of the present disclosure, the heat dissipation pattern 4201 is grounded. In this way, a signal shielding function of the heat dissipation pattern 4201 is ensured while the heat dissipation pattern 4201 has a heat dissipation function. Certainly, in addition to including the related film layer structures mentioned above, the composite heat dissipation structure may further arrange other film layer structures according to actual application needs, which are not limited herein.

Figure 13:
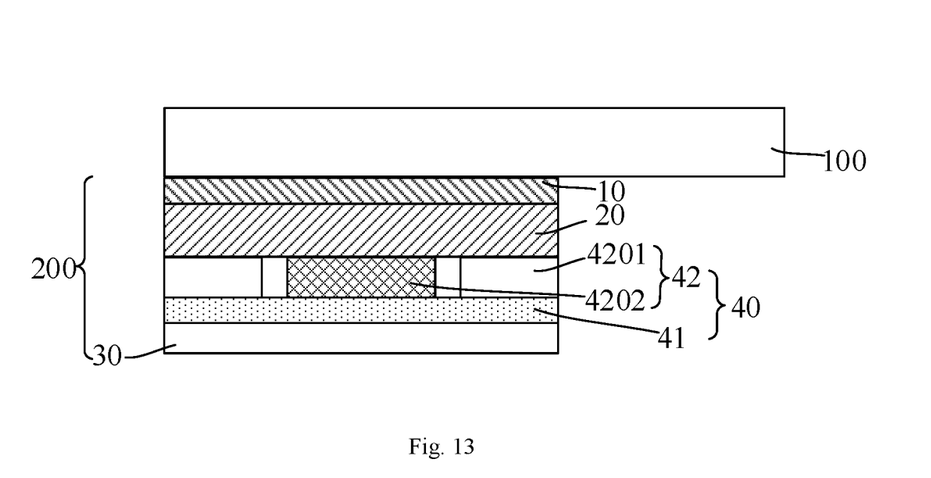
FIG. 13 is a schematic structural diagram of a display apparatus according to an embodiment of the present disclosure.

Based on the same disclosed concept, as shown in FIG. 13, embodiments of the present disclosure provide a display apparatus.

The display apparatus includes a display panel 100, and the above-mentioned composite heat dissipation structure 200 attached to a back face of the display panel 100. A grid tape 10 of the composite heat dissipation structure 200 is attached to the back face of the display panel 100.

In an implementation process, an entire face of the composite heat dissipation structure 200 may be attached to the back face of the display panel 100, such that antenna radiation capability of the display apparatus is improved. In addition, the display apparatus provided in the embodiments of the present disclosure may be an organic light emitting diode (OLED) display apparatus, or a quantum dot light emitting diodes (QLED) display apparatus, and certainly, may also be other display apparatuses selected according to actual application needs, which are not limited herein.

Figure 14:
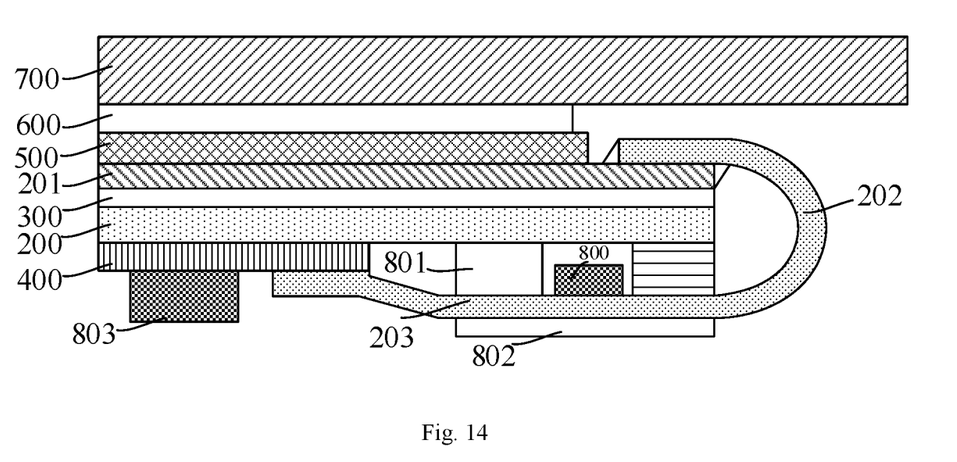
FIG. 14 is a schematic structural diagram of a display apparatus according to an embodiment of the present disclosure.

In the embodiments of the present disclosure, as shown in FIG. 14, the display panel 100 includes: a flat plate part 201, a bent part 202 and a fixed part 203. The bent part 202 is located between the flat plate part 201 and the fixed part 203. The fixed part 203 is bent to reach a back face of the flat plate part 201 by means of the bent part 202.

The display apparatus further includes: a support film 300 arranged between the flat plate part 201 and the composite heat dissipation structure, and a display circuit board 400 arranged between the fixed part 203 and the composite heat dissipation structure. The display circuit board 400 is coupled to a communication antenna pattern 4202 in the composite heat dissipation structure.

In the embodiments of the present disclosure, as shown in FIG. 14, the display circuit board 400 and the communication antenna pattern 4202 are welded by means of a welding point of the display circuit board 400 and/or crimped by means of an elastic sheet crimping point.

In the embodiments of the present disclosure, the display apparatus further includes a polarizer 500, a transparent optical adhesive 600 and a cover plate 700 that are arranged at a light emitting side of the display panel 100, a driver chip 800 arranged at the fixed part 203, a support column 801 between the composite heat dissipation structure and the fixed part 203, an protective adhesive 802 arranged at one side of the fixed part 203 facing away from the flat plate part 201, and a component 803 coupled to the display circuit board 400. The protective adhesive 802 may effectively protect the related circuit structures arranged on the fixed part 203. The component 803 may be a resistor, a capacitor, or another device structure. Certainly, the display apparatus may further include other film layers, and reference may be made to the related art for specific arrangement of other film layers, which is not described in detail herein. In an implementation process, a problem solving principle of the display apparatus is similar to that of the composite heat dissipation structure, so reference may be made to implementation of related parts of the composite heat dissipation structure 200 for implementation of the display apparatus, which is not repeated herein. In addition, the display apparatus provided in the embodiments of the present disclosure may be any product or component with an antenna function, such as a mobile phone, a tablet computer, a television, a display, a notebook computer, a digital photo frame, and a navigator. Other essential components of the display apparatus should be understood by those of ordinary skill in the art, which are not repeated herein and should not limit the present disclosure.

Embodiments of the present disclosure provide the composite heat dissipation structure 200 and the display apparatus. The composite heat dissipation structure 200 includes the grid tape 10, the buffer layer 20 and the ferrite layer 30 that are stacked in sequence, and the flexible printed circuit board 40 arranged at one side of the ferrite layer 30 facing the grid tape 10. The flexible printed circuit board 40 includes the substrate 41 and the conductive layer 42 on at least one side of the substrate 41. The conductive layer 42 has the heat dissipation pattern 4201 and the communication antenna pattern 4202, and the orthographic projection of the heat dissipation pattern 4201 on the substrate 41 and the orthographic projection of the communication antenna pattern 4202 on the substrate 41 do not overlap each other. In this way, heat dissipation and the communication antenna of the composite heat dissipation structure 200 are integrated, such that the composite heat dissipation structure 200 achieves a communication function of the antenna while having a heat dissipation function.

Although preferred embodiments of the present disclosure have been described, those skilled in the art can make additional changes and modifications to the embodiments once they learn the basic inventive concept. Therefore, the appended claims are intended to be interpreted as including the preferred embodiments and all changes and modifications falling within the scope of the present disclosure.

Apparently, those skilled in the art can make various modifications and variations to the present disclosure without departing from the spirit and scope of the present disclosure. In this way, if the modifications and variations of the present disclosure fall within the scope of the claims of the present disclosure and their equivalent technologies, the present disclosure is also intended to include the modifications and variations.

What is claimed is:

1. A composite heat dissipation structure, comprising:
   a grid tape, a buffer layer, and a ferrite layer that are stacked in sequence, and
   a flexible printed circuit board arranged at a side of the ferrite layer facing the grid tape,
   wherein the flexible printed circuit board comprises:
   a substrate, and
   a conductive layer on at least one side of the substrate, wherein the conductive layer is provided with:
   a heat dissipation pattern, and
   a communication antenna pattern,
   wherein an orthographic projection of the heat dissipation pattern on the substrate and an orthographic projection of the communication antenna pattern on the substrate do not overlap each other.

2. The structure according to claim 1, wherein the grid tape is reused as the substrate.

3. The structure according to claim 1, wherein the flexible printed circuit board is between the ferrite layer and the buffer layer.

4. The structure according to claim 1, wherein the conductive layer comprises:
   a first conductive layer at a side of the substrate facing the ferrite layer.

5. The structure according to claim 4, wherein the conductive layer further comprises:
   a second conductive layer at a side of the substrate facing away from the ferrite layer.

6. The structure according to claim 5, wherein the communication antenna pattern is distributed on both the first conductive layer and the second conductive layer, the communication antenna pattern distributed on the first conductive layer does not overlap the communication antenna pattern distributed on the second conductive layer, and the communication antenna pattern distributed on the first conductive layer is connected to the communication antenna pattern distributed on the second conductive layer through a via hole penetrating the substrate.

7. The structure according to claim 6, wherein the communication antenna pattern comprises:
   a first turn of coil on the second conductive layer; and
   a second turn of coil on the first conductive layer;
   wherein an orthographic projection of the second turn of coil on the substrate surrounds an orthographic projection of the first turn of coil on the substrate.

8. The structure according to claim 1, wherein the communication antenna pattern comprises:
   at least one turn of coil, and
   two lead wires coupled to two end points of the at least one turn of coil correspondingly.

9. The structure according to claim 8, wherein the heat dissipation pattern comprises:
   a part surrounded by the coil, and
   a part surrounding the coil.

10. The structure according to claim 9, wherein a distance between the coil and the adjacent heat dissipation pattern is not smaller than 1 mm.

11. The structure according to claim 8, wherein when the at least one turn of coil is a plurality of turns of coils, orthographic projections of the plurality of turns of coils on the substrate do not overlap each other.

12. The structure according to claim 1, wherein the heat dissipation pattern is grounded.

13. A display apparatus, comprising:
    a display panel, and
    the composite heat dissipation structure attached to a back face of the display panel according to claim 1,
    wherein the grid tape of the composite heat dissipation structure is attached to the back face of the display panel.

14. The display apparatus according to claim 13, wherein the display panel comprises:
    a flat plate part,
    a bent part, and
    a fixed part,
    wherein the bent part is between the flat plate part and the fixed part, and the fixed part is bent to reach a back face of the flat plate part through the bent part.

15. The display apparatus according to claim 14, wherein the display circuit board and the communication antenna pattern are welded through a welding point of the display circuit board and/or crimped through an elastic sheet crimping point.

16. The display apparatus according to claim 14, further comprising:
    a support film between the flat plate part and the composite heat dissipation structure, and
    a display circuit board between the fixed part and the composite heat dissipation structure;
    wherein the display circuit board is coupled to the communication antenna pattern in the composite heat dissipation structure.

17. The structure according to claim 1, wherein the buffer layer is reused as the substrate.

18. The structure according to claim 1, wherein the flexible printed circuit board is between the grid tape and the buffer layer.

* * * * *